(12) United States Patent
Venkatasamy et al.

(10) Patent No.: US 7,842,938 B2
(45) Date of Patent: Nov. 30, 2010

(54) PROGRAMMABLE METALLIZATION CELLS AND METHODS OF FORMING THE SAME

(75) Inventors: Venkatram Venkatasamy, Edina, MN (US); Ming Sun, Eden Prairie, MN (US); Michael Xuefei Tang, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 4 days.

(21) Appl. No.: 12/269,514

(22) Filed: Nov. 12, 2008

(65) Prior Publication Data

US 2010/0117052 A1    May 13, 2010

(51) Int. Cl.
H01L 47/00    (2006.01)
(52) U.S. Cl. .................... 257/4; 257/E47.001
(58) Field of Classification Search .......... 257/2, 257/3, 4
See application file for complete search history.

(56) References Cited

U.S. PATENT DOCUMENTS

| | | | |
|---|---|---|---|
| 5,761,115 A | 6/1998 | Kozicki | |
| 6,985,378 B2 | 1/2006 | Kozicki | |
| 7,093,347 B2 | 8/2006 | Nowak | |
| 7,189,435 B2 | 3/2007 | Tuominen | |
| 7,511,294 B2* | 3/2009 | Ufert | 257/5 |
| 7,737,428 B2* | 6/2010 | Symanczyk et al. | 257/3 |
| 7,750,386 B2* | 7/2010 | Tian et al. | 257/296 |
| 2003/0165625 A1* | 9/2003 | So et al. | 427/385.5 |
| 2006/0046379 A1* | 3/2006 | Symanczyk et al. | 438/238 |
| 2006/0060832 A1 | 3/2006 | Symanczyk | |
| 2006/0063052 A1 | 3/2006 | Hu | |
| 2006/0181920 A1* | 8/2006 | Ufert | 365/153 |
| 2006/0245117 A1 | 11/2006 | Nowak | |
| 2007/0171694 A1 | 7/2007 | Huai | |
| 2008/0026253 A1 | 1/2008 | Yuasa | |
| 2008/0061388 A1 | 3/2008 | Diao | |
| 2008/0180991 A1 | 7/2008 | Wang | |
| 2008/0191251 A1 | 8/2008 | Ranjan | |
| 2008/0253166 A1* | 10/2008 | Raberg et al. | 365/148 |
| 2008/0314738 A1* | 12/2008 | Gopalakrishnan et al. | 204/247.4 |

OTHER PUBLICATIONS

W.W. Zhuang et al., Tech Dig. IEDM (2002) 193.
G.I. Baek et al., Tech. Dig. IEDM (2005) 750.
G.I. Baek et al., Tech. Dig. IEDM (2004) 587.
T. Thurn-Albrecht et al., Science, 290, 2126 (2000).
U.S. Appl. No. 12/106,382, filed Apr. 21, 2008, Xi.
U.S. Appl. No. 12/170,519, filed Jul. 10, 2008, Xi.
U.S. Appl. No. 12/269,507, filed Nov. 12, 2008, Tian.
U.S. Appl. No. 12/269,537, filed Nov. 12, 2008, Tang.
Hideki Masuda and Kenji Fukuda, Science, 268, 1466 91995).
Masuda et al., Ordered Metal Nanohole Arrays Made by a Two-Step Replication of Honeycomb Structures of Anodic Alumina, Science, OI. 268, Jun. 9, 1995.

(Continued)

*Primary Examiner*—Benjamin P Sandvik
(74) *Attorney, Agent, or Firm*—Campbell Nelson Whipps LLC

(57) ABSTRACT

A programmable metallization cell (PMC) that includes an active electrode; a nanoporous layer disposed on the active electrode, the nanoporous layer comprising a plurality of nanopores and a dielectric material; and an inert electrode disposed on the nanoporous layer. Other embodiments include forming the active electrode from silver iodide, copper iodide, silver sulfide, copper sulfide, silver selenide, or copper selenide and applying a positive bias to the active electrode that causes silver or copper to migrate into the nanopores. Methods of formation are also disclosed.

9 Claims, 5 Drawing Sheets

OTHER PUBLICATIONS

Song-Zhu Chu et al., Fabrication of Ideally Ordered Nanoporous Alumina Films and Integrated Alumina Nanotubule Arrays by High-Field Anodization, Adv. Mater. 2005, 17, 2115-2119.

Macak et al., High-Aspect-Ratio TiO2, Nanotubes by Anodization of Titanium, Angew. Chem. Int. Ed. 2005, 44, 2100-2102.

A. Huczko, Template-Based Synthesis of Nanomaterials, Appl. Phys. A 70, 365-376 (2000).

Yan et al., "Magnesium Oxide as a Candidate High- K Gate Dielectric", 2006, Applied Physics Lett., vol. 88, pp. 142901-1-14901-3.

Wendt et al., "Electronic and Vibrational Properties of Ultrathin SiO2 Films Grown on Mo(112)", 2005, Phys. Rev., vol. B72, pp. 1150409-1-115409-9.

* cited by examiner

| 610 |
|---|
FIG. 6a
| 615 |
|---|
| 610 |
FIG. 6b
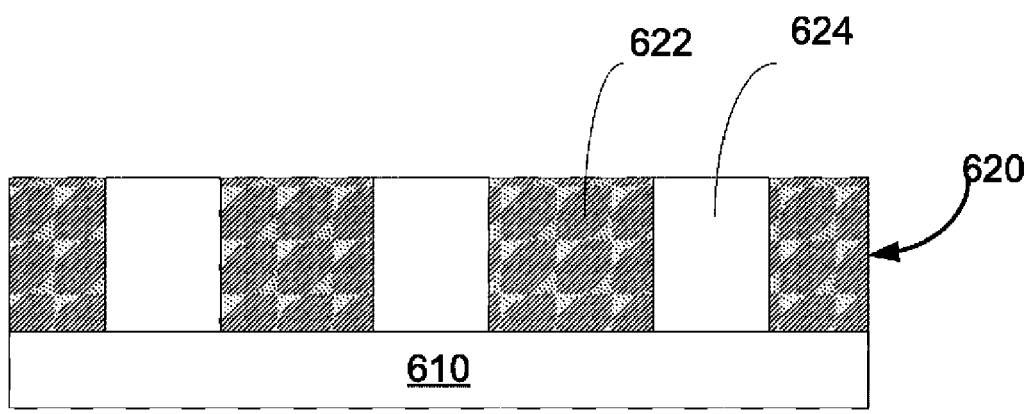
FIG. 6c
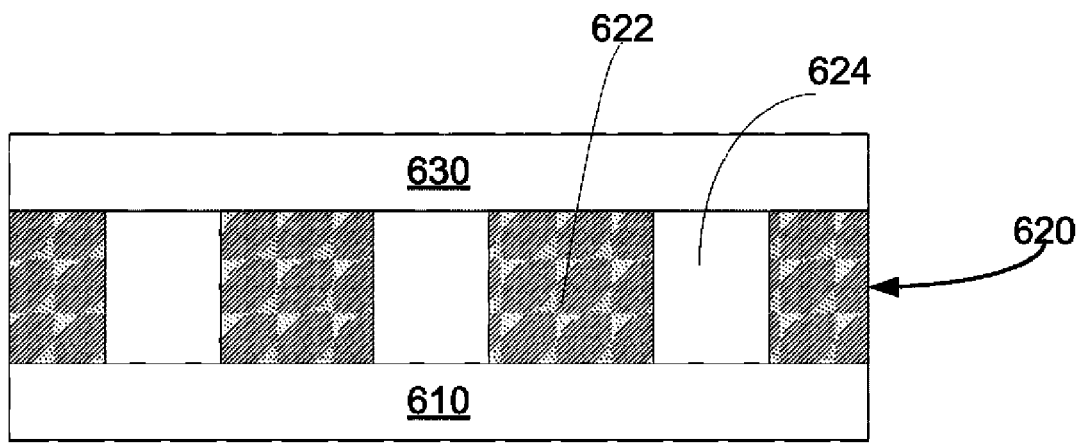
FIG. 6d

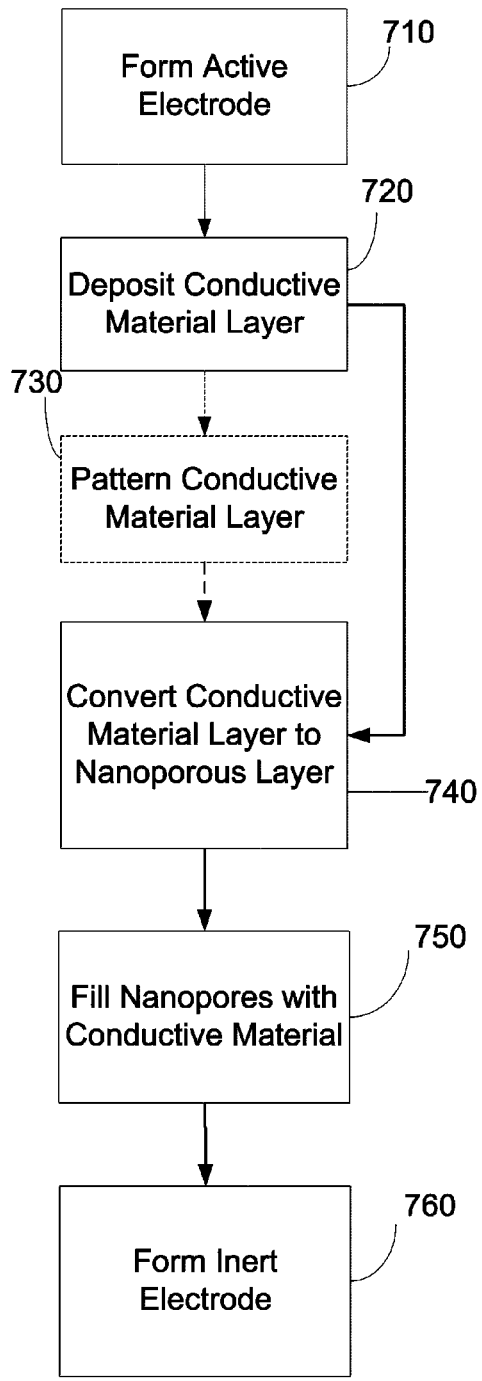
FIG. 7
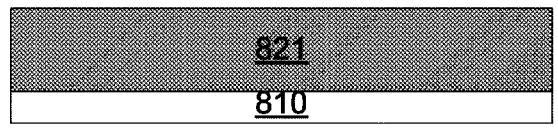
FIG. 8a
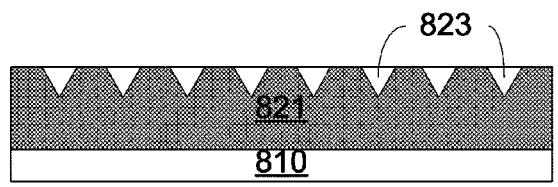
FIG. 8b
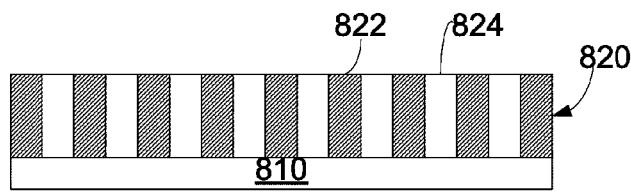
FIG. 8c
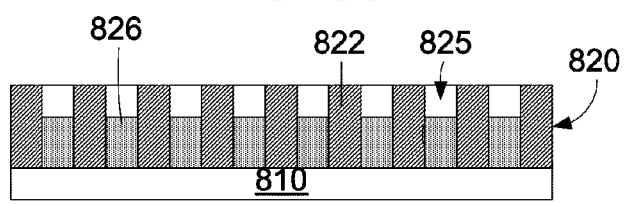
FIG. 8d
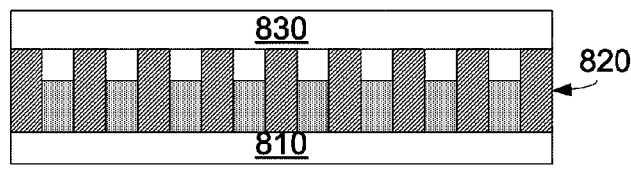
FIG. 8e
FIG. 8f

PROGRAMMABLE METALLIZATION CELLS AND METHODS OF FORMING THE SAME

BACKGROUND

The programmable metallization cell (PMC) is a new type of memory that is a candidate to eventually replace flash memory. PMC can offer the benefits of longer lifetimes, lower power and better memory density. As PMC is still being developed, there remains a need for novel or advantageous PMCs for use in memory applications.

BRIEF SUMMARY

Disclosed herein is a programmable metallization cell (PMC) that includes an active electrode; a nanoporous layer disposed on the active electrode, the nanoporous layer comprising a plurality of nanopores and a dielectric material; and an inert electrode disposed on the nanoporous layer.

Disclosed herein is a method of forming a programmable metallization cell (PMC), the method including the steps of forming an active electrode; depositing a layer of aluminum on the active electrode; oxidizing the layer of aluminum to form a nanoporous layer of aluminum oxide, the nanoporous layer including nanopores; at least partially filling at least some of the nanopores in the nanoporous layer by electroplating a conductive material; and forming an inert electrode on the nanoporous layer of aluminum oxide.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIGS. 6a through 6d are cross-sectional views of a PMC at various stages of manufacture;

FIG. 7 is a flowchart illustrating exemplary methods for forming a PMC;

FIGS. 8a through 8f are cross sectional views of a PMC at various stages of manufacture.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", and "on top", if used herein, are utilized for ease of description to describe spatial relationships of an element(s) to another. Such spatially related terms encompass different orientations of the device in use or operation in addition to the particular orientations depicted in the figures and described herein. For example, if a cell depicted in the figures is turned over or flipped over, portions previously described as below or beneath other elements would then be above those other elements.

As used herein, when an element, component or layer for example is described as being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

Disclosed herein are programmable metallization cells (PMCs), devices and arrays including PMCs, methods of forming PMCs and methods of using PMCs.

Figure 1A:
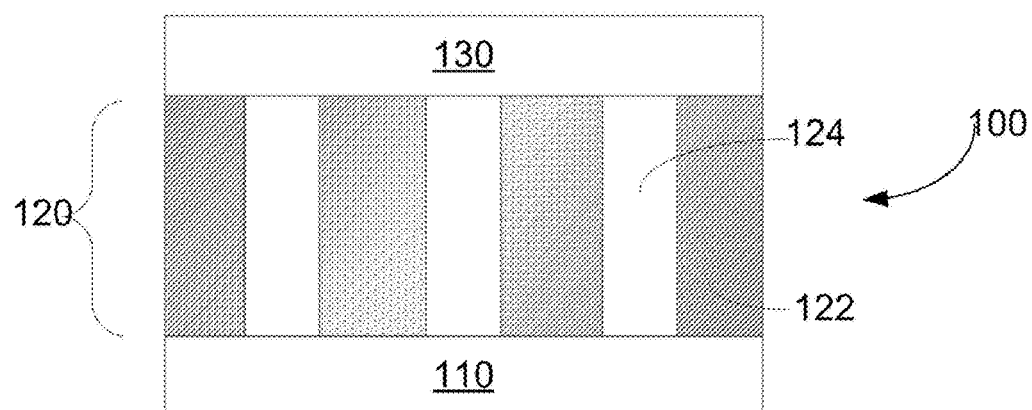
FIG. 1a is a cross sectional view of a programmable metallization cell (PMC)

An illustrative example of a programmable metallization cell (PMC) is depicted in FIG. 1. An embodiment of a PMC 100 includes an active electrode 110, a nanoporous layer 120 and an inert electrode 130. The nanoporous layer 120 is disposed on the active electrode 110. In an embodiment, the nanoporous layer 120 is disposed directly on the active electrode 110. In an embodiment, there can be one or more than one layer between the active electrode 110 and the nanoporous layer 120. The inert electrode 130 is disposed on the nanoporous layer 120. In an embodiment, the inert electrode 130 is disposed directly on the nanoporous layer 120. In an embodiment, there can be one or more than one layer between the nanoporous layer 120 and the inert electrode 130.

The active electrode 110 can be formed of any suitable conductive material. In an embodiment, a suitable conductive material can include silver (Ag) or copper (Cu). In an embodiment, the active electrode 110 can be made of a material such that when a sufficient bias is applied across the electrodes (active electrode 110 and inert electrode 130) material of the active electrode 110 can migrate into at least a portion of the nanoporous layer 120. In an embodiment, the active electrode 110 can include for example, silver iodide (AgI), silver sulfide (AgS), silver selenide (AgSe) copper iodide (CuI), copper sulfide (CuS) or copper selenide (CuSe). Generally, the active electrode 110 can have thicknesses as are commonly utilized. In an embodiment, the active electrode 110 can have a thickness of from about 50 Å to about 5000 Å.

The inert electrode 130 can be formed of any suitable conductive material. In an embodiment, a suitable conductive material can include, but is not limited to, tungsten (W), nickel (Ni), molybdenum (Mo), platinum (Pt), gold (Au), palladium (Pd) and rhodium (Rh) for example. Generally, the inert electrode 130 can have thicknesses as are commonly utilized. In an embodiment, the inert electrode 130 can have a thickness of from about 50 Å to about 5000 Å.

When a positive bias is applied to the active electrode, material from the active electrode will migrate towards the inert electrode. Once the material from the active electrode comes into contact with the inert electrode, it is reduced and electrodeposited, forming a nanowire. Formation of the nanowire(s) creates the low resistance state of the PMC. When the electrodes are oppositely biased, the atoms in the nanowires are oxidized and migrate back towards the negatively biased active electrode. This breaks the nanowires returning the PMC to the high resistance state.

Figure 1B:
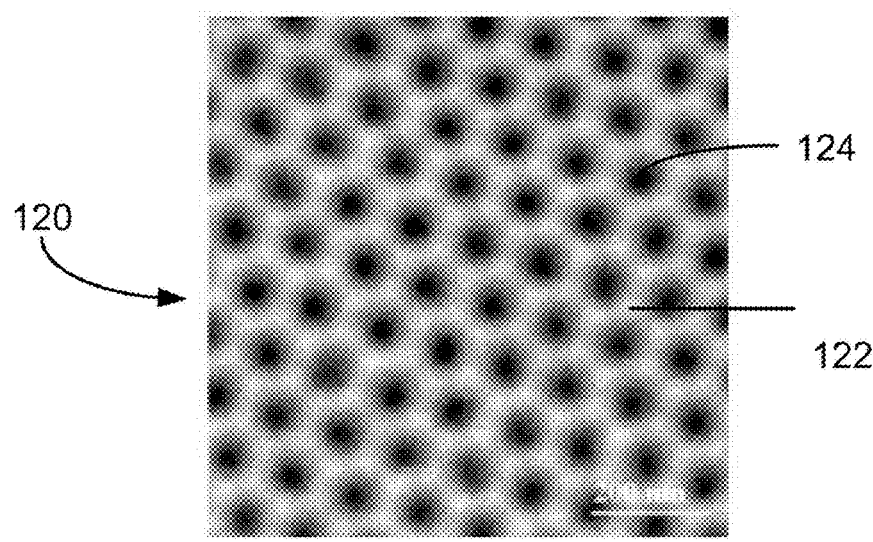
FIG. 1b is a perspective view of an exemplary nanoporous layer of a PMC.

The nanoporous layer 120 generally includes a plurality of pores, for example nanopores 124 and dielectric material 122. In an embodiment, the plurality of nanopores are dispersed, randomly or uniformly, throughout the dielectric material. In an embodiment, the dielectric material 122 can be continuous and the nanopores 124 can be dispersed within the continuous dielectric material 122. FIG. 1b illustrates a perspective view of an exemplary nanoporous layer 120 showing the nanopores 124 and the continuous nature of the dielectric material 122.

In an embodiment, the nanopores 124 can have uniform, substantially uniform, variable (or any characterization in between) diameters. In an embodiment, the nanopores 124 can have diameters in the nanometer (nm) range. In an embodiment, the nanopores can have diameters from about 2 nm to about 200 nm. In an embodiment, the nanopores can have diameters from about 4 nm to about 100 nm. In an embodiment, the nanopores 124 can have variable depths. In an embodiment, the nanopores 124 span the entire thickness of the nanoporous layer 120. The depth of the nanopores 124 is at least partially controlled by the depth of the starting material from which the nanoporous layer 120 is formed. In an embodiment, the depth of the nanopores 124 can depend at least in part on the particular properties (including, but not limited to switching time and switching current) that are desired in the PMC.

In an embodiment, the nanopores 124 can be regularly dispersed in the dielectric material 122. In an embodiment the nanopores 124 can be randomly dispersed in the dielectric material. In an embodiment, portions of the nanoporous layer 120 can have regions where the nanopores 124 are uniformly distributed and portions where the nanopores 124 are less uniformly or even randomly distributed. The nanopores 124, if uniformly distributed can be distributed in any pattern. In an embodiment, the nanopores 124 can be distributed in a hexagonally arranged pattern (such as that depicted in FIG. 1b for example). In embodiments where the nanopores 124 are uniformly distributed, the distribution can be due entirely to the method of forming the nanoporous layer or can be controlled before the method of forming the nanoporous layer is undertaken.

The dielectric material 122 is at least partially controlled by the material from which the nanoporous layer 120 is formed. Generally, the dielectric material 122 is one that has dielectric properties, can optionally provide mechanical stability, and can be formed as a nanoporous layer. In an embodiment, the dielectric material 122 can include dielectric inorganic materials, such as alumina ($Al_2O_3$), zirconia ($ZrO_2$), titania ($TiO_2$) and mesoporous silica; polymers such as polystyrene and electrically conductive polymers such as polypyrrole, poly(3-methylothiophene) and polyaniline. In an embodiment where the dielectric material 122 is a polymer, it can be a crosslinked polymer, such as crosslinked polystyrene.

The structure of the dielectric material 122 is generally controlled by the distribution and shape of the nanopores 124 which is at least partially controlled by the way in which the nanoporous layer 120 is formed. Generally, the dielectric material 122 can have a thickness that spans the distance from the active electrode 110 to the inert electrode 130 (or any other layers that may be disposed therein). In an embodiment, the thickness of the dielectric material 122 is dependent, at least in part, on the thickness of the material from which the nanoporous layer 120 was formed, the method by which the nanoporous layer 120 was formed and any processing steps that were carried out on the nanoporous layer 120 during formation. In an embodiment, the dielectric material 122 has a thickness from about 100 Å to about 500 Å.

Figure 2:
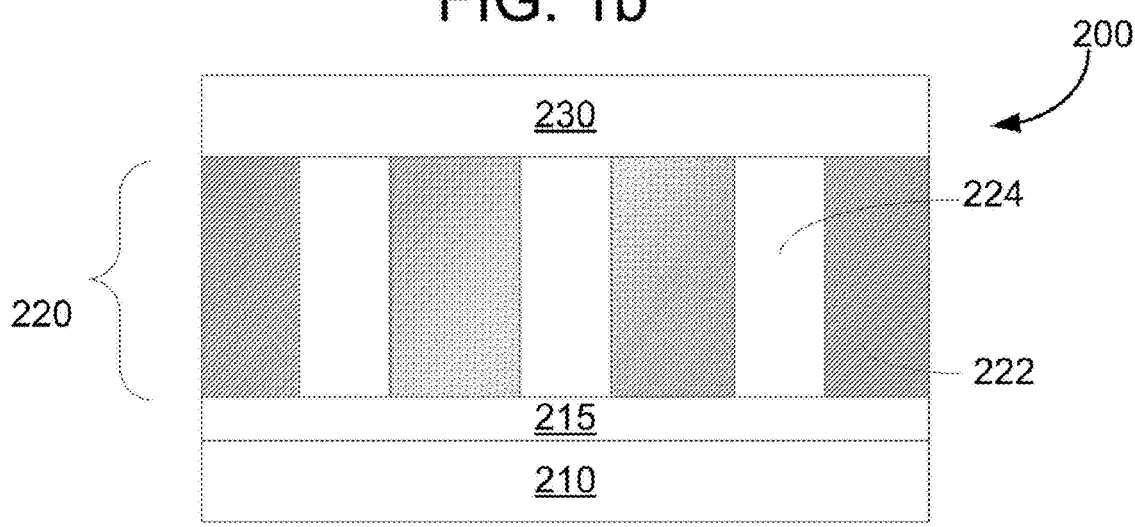
FIG. 2 is a cross sectional view of a programmable metallization cell (PMC) that includes an optional sink layer.

A PMC as disclosed herein can also optionally include a sink layer. A PMC that includes a sink layer can be seen in FIG. 2. This exemplary PMC 200 includes an active electrode 210 on which is disposed a sink layer 215, a nanoporous layer 220 disposed on the sink layer 215 and an inert electrode 230 disposed on the nanoporous layer 220. In an embodiment, the sink layer 215 can be disposed directly on the active electrode 210, the nanoporous layer 220 can be disposed directly on the sink layer 215 and the inert electrode 230 can be disposed directly on the nanoporous layer 220.

The sink layer 215 can generally function as a source of ions. In an embodiment, the sink layer 215 can include a material that is similar to the active electrode 210. In an embodiment, the sink layer 215 and the active electrode 210 can have an element in common. In an embodiment, the sink layer 215 can include silver (Ag) or copper (Cu). In an embodiment where the active electrode 210 can include silver iodide (AgI), silver sulfide (AgS) or silver selenide (AgSe), the sink layer 215 can include silver (Ag). In an embodiment where the active electrode 210 can include copper iodide (CuI), copper sulfide (CuS) or copper selenide (CuSe), the sink layer 215 can include copper (Cu). Generally, the sink layer 215 can have thicknesses as are commonly utilized. In an embodiment, the sink layer 215 can have a thickness of from about 50 Å to about 300 Å.

In an embodiment, a PMC as disclosed herein includes an active electrode that includes silver iodide (AgI), silver sulfide (AgS), silver selenide (AgSe) copper iodide (CuI), copper sulfide (CuS), copper selenide (CuSe); a nanoporous layer disposed on the active electrode, the nanoporous layer including a plurality of nanopores and a dielectric material; and an inert electrode disposed on the nanoporous layer.

When a positive bias is applied to the active electrode, material from the active electrode will migrate towards the inert electrode through the pores of the nanoporous layer. In an embodiment where the active electrode includes silver iodide (AgI), the silver ions ($Ag^+$) from the active electrode will migrate through the pores of the nanoporous layer towards the inert electrode. Once the material (e.g. $Ag^+$) comes into contact with the inert electrode, they will be reduced and electrodeposited, forming a nanowire (e.g. a nanowire of silver (Ag) metal). Once the nanowires are formed across the nanoporous layer, this is the low resistance state of the PMC. When the electrodes are oppositely biased, the atoms in the nanowires (e.g. silver (Ag)) are oxidized and migrate back towards the negatively biased active electrode. This breaks the nanowires returning the PMC to the high resistance state.

Reading the PMC utilizes a small voltage applied across the cell. If the nanowires are present in that cell, the resistance will be low, leading to higher current, which is generally read as a "1". If there are no nanowires present or the nanowires do not span the nanoporous layer, the resistance is higher, leading to low current, which is generally read as a "0".

Erasing the cell can be carried out by applying a negative bias to the active electrode. The metal ions will migrate away from the inert electrode, back into the negatively-charged active electrode. This breaks the linkage across the cell and increases the resistance of the PMC.

A voltage can also be applied across the PMC in order to deposit conductive material in at least some of the nanopores. Depending on the voltage applied to the active electrode, a portion of the material from the active electrode may deposit in the nanopores. This material may at least partially fill at least some of the nanopores, but not form a nanowire across the entire nanoporous layer. This deposited material can function to decrease the switching time of the PMC by partially forming the nanowire necessary for changing the PMC from a high resistance state to a low resistance state.

Disclosed herein is a PMC that includes an active electrode that includes silver iodide (AgI), silver sulfide (AgS), silver selenide (AgSe) copper iodide (CuI), copper sulfide (CuS), copper selenide (CuSe); a nanoporous layer disposed on the active electrode, the nanoporous layer including a plurality of nanopores and a dielectric material, with material from the active electrode at least partially filling the nanopores; and an inert electrode disposed on the nanoporous layer.

Also disclosed herein are methods of forming PMCs. Methods of forming PMCs as disclosed herein can offer advantages over other methods of forming PMCs. Commonly utilized methods of forming PMCs utilize chalcogenide glass, which generally has to be deposited using a variety of physical methods, such as physical vapor deposition (PVD). PVD can be an expensive technique that operates at high temperatures and pressures, utilizes costly equipment and metal targets. It also usually requires stringent hazard monitoring. Furthermore, filling PMC materials in trench structures using PVD generally results in poor uniformity and amorphous deposits. Also, upon crystallization, chalcogenide materials undergo a considerable volume shrinkage which further affects the uniformity of the deposit in the trenches, due to the creation of voids. The methods of forming and utilizing nanoporous layers, as described herein, can avoid these and other disadvantages of previously utilized methods of forming PMCs.

Figure 3:
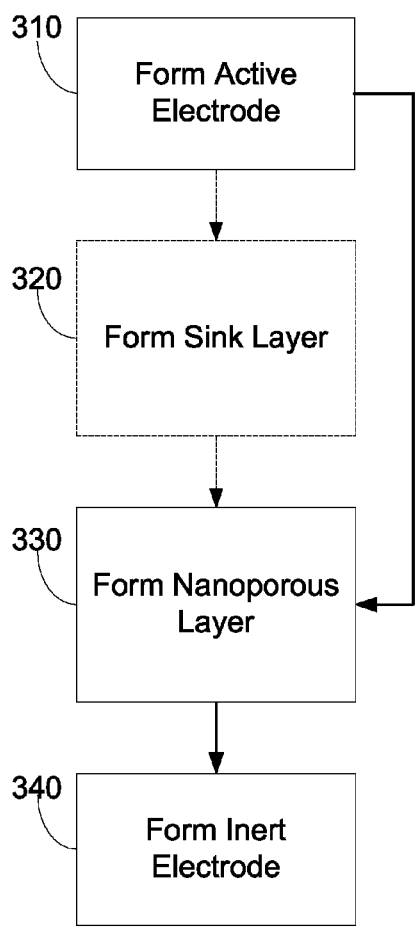
FIG. 3 is a flowchart illustrating exemplary methods for forming a PMC.

FIG. 3 illustrates exemplary methods of producing a PMC as disclosed herein. The methods depicted in FIG. 3 begin with step 310, forming an active electrode. As discussed above, the active electrode can be formed of any suitable conductive material; exemplary materials include, but are not limited to, silver iodide (AgI), silver sulfide (AgS), silver selenide (AgSe) copper iodide (CuI), copper sulfide (CuS) or copper selenide (CuSe).

The active electrode can be, but need not be formed on, partially in, or in a substrate. The substrate, if utilized, can include any substrate commonly utilized to fabricate memory devices. Exemplary substrates include, but are not limited to silicon, a mixture of silicon and germanium, and other similar materials. FIG. 6a illustrates an exemplary article after completion of this first step, FIG. 6a does not depict an optional substrate, but does show the active electrode 610. Generally, the active electrode 610 can be formed by using known deposition methods, such as for example physical vapor deposition (PVD), chemical vapor deposition (CVD), electrochemical deposition (ECD), molecular beam epitaxy (MBE) and atomic layer deposition (ALD).

One exemplary method depicted in FIG. 3 includes, as a next step, optional step 320, forming a sink layer. As discussed above, the sink layer is an optional component of a PMC and as such, formation of the sink layer is an optional step that can, but need not be carried out. As discussed above, the sink layer generally functions as a source of ions. In an embodiment, the sink layer can include a material that is similar to the active electrode; for example, silver (Ag) or copper (Cu). If the sink layer is formed in the exemplary method, it can be formed on the active electrode; in an embodiment, it can be formed directly on the active electrode. Generally, the sink layer can be formed using known deposition methods, including, but not limited to, PVD, CVD, ECD, MBE and ALD. FIG. 6b illustrates an exemplary article that includes a sink layer 615 disposed on (e.g. directly on) the active electrode 610.

A next step in an exemplary method, either carried out after step 310, formation of the active electrode or step 320, formation of the sink layer; is step 330, formation of the nanoporous layer. The nanoporous layer can be formed on (or directly on) the active electrode; or on (or directly on) the sink layer. FIG. 6c illustrates an exemplary article after this step has been carried out. As seen in FIG. 6c, the nanoporous layer 620 is formed on the active electrode 610 (the optional sink layer 615 depicted in FIG. 6b is not depicted in the articles shown in FIGS. 6c and 6d); and in an embodiment directly on the active electrode 610. As discussed above, the nanoporous layer 620 includes nanopores 624 and dielectric material 622. Two exemplary methods of forming a nanoporous layer are illustrated in FIGS. 4 and 5.

One exemplary method of forming the nanoporous layer is through formation and processing of diblock copolymers. Such a method generally utilizes the self-assembled morphology of diblock copolymer thin films. Such methods are based on well-ordered equilibrium structures, which can be controlled by macromolecular properties, scaled by the molecular weight of the components and utilized with numerous block copolymer combinations. Formation of a nanoporous layer utilizing diblock copolymers will be demonstrated through the use of polystyrene and polymethylmethacrylate; however, it can be carried out using other polymers.

Figure 4:
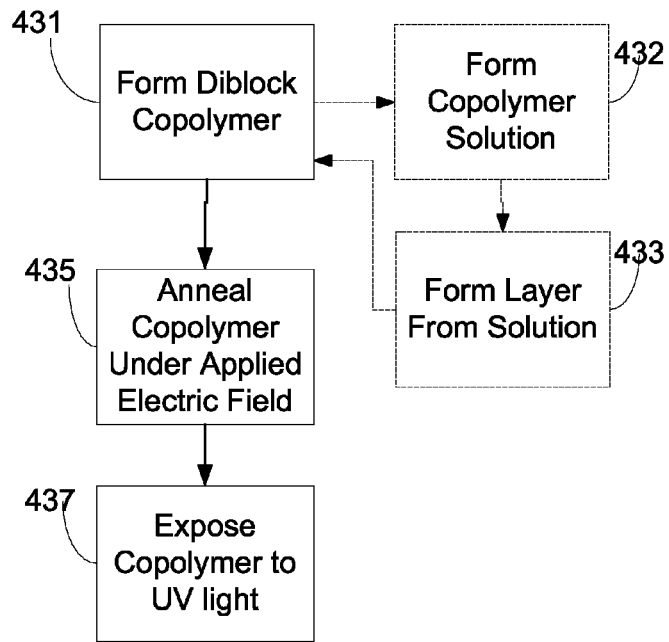
FIG. 4 is a flowchart illustrating an exemplary method for forming a nanoporous layer.
Figure 5:
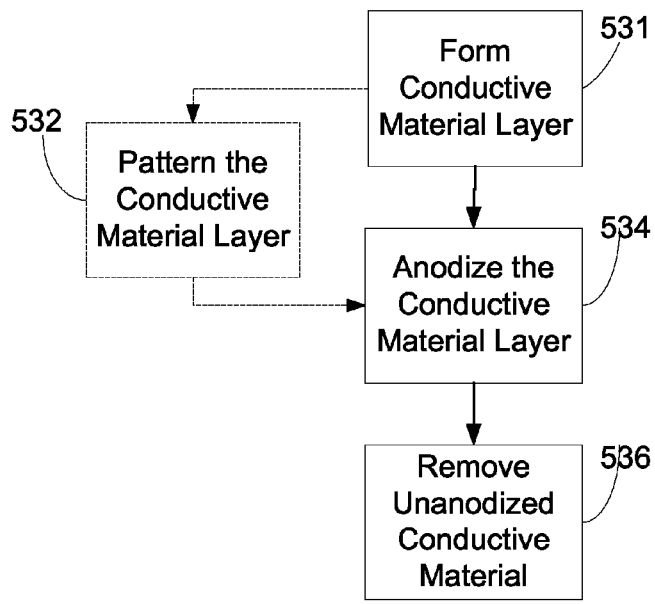
FIG. 5 is a flowchart illustrating exemplary methods for forming a nanoporous layer.

The exemplary steps in FIG. 4 include step 431, formation of a diblock copolymer. One exemplary way of forming a diblock copolymer includes optional steps 432, forming a copolymer solution and 433, forming a layer from the copolymer solution. Step 432 can include combining the two polymer materials in a suitable solvent. The choice of solvents can depend, at least in part on the particular polymers utilized. In an exemplary embodiment utilizing polystyrene and polymethylmethacrylate, toluene can be utilized as a solvent. Step 433 can include forming a layer or film from the copolymer solution. In an embodiment utilizing polystyrene and polymethylmethacrylate, a film can be formed from a toluene solution using spin casting methods.

After formation of the diblock copolymer, step 431, the next step in an exemplary method includes annealing the copolymer under an applied electric field. This step can function to cause cylindrical microdomains of the two polymers to orient parallel to the electric field lines. After this step, the diblock copolymer can be characterized as a block of one of the polymers that contains columnar deposits of the other polymer. After this step, the next step, step 437, includes exposing the copolymer to UV light. This step functions to degrade the polymer that has formed columnar deposits within the other polymer. In an embodiment where polystyrene and polymethylmethacrylate are utilized, the polymethylmethacrylate will form columnar deposits within the polystyrene, and will be broken down by the UV exposure. This will ultimately form a block of polystyrene (which can be at least partially crosslinked by the UV light) with columnar voids (where the polymethylmethacrylate was located before the UV exposure).

A specific method of forming a nanoporous layer utilizing diblock copolymers can be described as follows. Polystyrene (0.71 volume fraction) and polymethylmethacrylate with a molecular weight of 39,600 daltons and a polydispersity of 1.08 can be dissolved in toluene. The solution can then be spin-cast into a diblock copolymer film (about 1 micrometer (μm) thick) onto a conducting substrate (e.g. the active electrode). The copolymer film can then be annealed for about 14 hours, above the glass transition temperature of both components (105° C. for polystyrene and 115° C. for polymethylmethacrylate) or about 165° C. under an applied electric field (dc field of 30 to 40 V/μm can be applied across the active electrode and a second conductive material, such as a Kapton film placed over the copolymer). The sample can then be cooled to room temperature, the field removed and the second conductive material removed. Then, the diblock copolymer can be subjected to ultraviolet exposure (25 J/cm$^2$). After UV exposure, the diblock copolymer can be rinsed, for example with acetic acid, to remove the degraded polymethylmethacrylate. Such a method can be utilized to fabricate an array of 14 nm diameter cylindrical voids in a crosslinked polystyrene matrix with a lattice constant of about 24 nm.

Another method for forming a nanoporous layer includes electrochemical processing (e.g. oxidation) of a conductive material, such as aluminum (Al), titanium (Ti) and zirconium (Zr). Such a method is depicted in FIG. 5 and is exemplified with respect to aluminum (Al), although other materials (such as titanium (Ti), zirconium (Zr) and silica (Si) for example) can also be utilized. An initial step in such a method can include step 531, forming an aluminum layer. In an embodiment, the aluminum layer can have a generally uniform thickness of about 1 mm. An aluminum layer can be formed using known methods, including but not limited to PVD, CVD, ECD, MBE and ALD. The next step, step 534, includes anodizing the aluminum layer. Generally, anodizing the aluminum functions to convert at least a portion of the aluminum to aluminum oxide or alumina ($Al_2O_3$). The process of anodizing aluminum not only converts at least a portion of the aluminum to alumina but also creates pores in the alumina.

In an embodiment, anodization can be carried out by submerging the aluminum layer in an acidic solution and applying a voltage to the aluminum. In an embodiment, the aluminum can function as the anode and a platinum electrode placed in the solution can serve as the cathode. In an embodiment, anodization can be carried out using an oxalic acid solution (e.g. 0.3 M oxalic acid solution) and applying a constant voltage of about 40 V for example. The process can be carried out at low temperatures for example, from about 2° C. to about 5° C. The arrangement of the pores in the alumina can be controlled, at least in part, by the conditions of anodization. In an embodiment, anodization for longer periods than necessary can be utilized to prepare alumina with more ordered pores. Generally, the size of regions of highly ordered pores (which can be referred to as defect free regions) can be increased by increasing the anodization time. The uniformity of the pores can generally be increased by increasing the thickness of the aluminum (Al) layer that is anodized.

FIG. 5 illustrates an optional step that can also be utilized to increase the regularity of the pores in the alumina. Optional step 532 includes patterning the aluminum layer before it is anodized. Patterning the aluminum layer can function to at least partially control the location of the pores. Generally, a "defect" in the aluminum layer can dictate where a pore will be formed within the alumina. Patterning can create ordered "defects" on the surface of the aluminum. Patterning can be accomplished by for example, pretexturing the aluminum layer, by using for example, a textured silicon carbide (SiC) molder to produce indentations on the aluminum.

After the aluminum layer is anodized (whether pre-patterned or not), the next step, step 536, is to remove unanodized aluminum. In embodiments, there can be a portion of the aluminum which was not anodized, i.e. not converted into alumina and through which pores were not created. Generally, a chemical method can be utilized to remove the unanodized aluminum. In an embodiment, an acid can be utilized to remove the unanodized aluminum; for example with a saturated solution of $HgCl_2$. In an embodiment, the pore size can be controlled or modified by post-processing methods, such as treatment with an acidic solution (e.g., 5% by weigh phosphoric acid solution at 30° C.).

After formation of the nanoporous layer, step 330, the next step, step 340, is to form the inert electrode. As discussed above, the inert electrode can be formed of any suitable conductive material; such as, tungsten (W), nickel (Ni), molybdenum (Mo), platinum (Pt), gold (Au), palladium (Pd) and rhodium (Rh) for example. Generally, the inert electrode can be formed using known deposition methods, including, but not limited to, PVD, CVD, ECD, MBE and ALD. FIG. 6*d* illustrates an article after formation of the inert electrode. As seen in FIG. 6*d*, the inert electrode 630 can be formed on or directly on the nanoporous layer 620.

FIG. 7 depicts another exemplary embodiment of a method of forming a PMC as disclosed herein. FIGS. 8*a* through 8*f* depict the article at various stages of the method of making it. The first step in this exemplary method includes step 710, forming an active electrode. The article after completion of this step is illustrated in FIG. 8*a* and includes active electrode 810. The step of forming the active electrode, step 710, and characteristics of the active electrode 810 were discussed above.

FIG. 7 also depicts the next step, step 720, deposition of a conductive material, such as an aluminum (Al), zirconium (Zr) or titanium (Ti) layer. The article after completion of this step is illustrated in FIG. 8*b* and includes aluminum layer 821, disposed on, or directly on active electrode 810. The aluminum layer can be deposited using known methods, including but not limited to, PVD, CVD, ECD, MBE and ALD. In an embodiment, the aluminum layer can have a thickness from about 100 Å to about 500 Å.

FIG. 7 also depicts an optional step, step 730, patterning the aluminum layer. The article, after completion of this step is illustrated in FIG. 8*c* and includes defects 823 created in the aluminum layer 821. The defects 823 can be created by for example, pretexturing of the aluminum. The shape of the defects are not necessarily important, and the pyramid structures illustrated in FIG. 8c are only a non-limiting example of a defect that could be formed.

The next step, whether the optional step of patterning (step 730) was carried out or not, is to convert the aluminum layer to a nanoporous layer. Generally, this step can be carried out by oxidizing the aluminum (converting it to alumina, $Al_2O_3$ which is a dielectric material) and creating pores within the alumina. One method of carrying this out is to anodize the aluminum in an acidic solution by application of a voltage. Specific exemplary parameters for carrying out this step were discussed above. FIG. 8d illustrates the article after this step has been carried out and shows the nanoporous layer 820 disposed on, or directly on the active electrode 810. The nanoporous layer 820 includes pores 824 and dielectric material 822.

The next step, shown in FIG. 7 includes step 750, at least partially filling at least some of the nanopores with conductive material. The step of at least partially filling at least some of the nanopores with a conductive material can function to reduce the amount of time necessary to switch the PMC from the high resistance state to the low resistance state by forming at least part of the nanowire across the nanoporous layer. FIG. 8e depicts an article after completion of this step and shows partially filled pores 825 that are partially filled with conductive material 826.

This step can be accomplished using electrodepositing techniques. In an embodiment, conductive material can be deposited in at least a portion of the nanopores. The active electrode can function as the electrode in the electrodeposition process, this will allow for deposition of the conductive material inside the pores only, as the dielectric material is non-conducting. In an embodiment where the electrodeposition process results in the nanopores being overfilled (thereby "spilling" conductive material onto the top surface of the nanoporous layer) further processing steps can be carried out to remove the conductive material from the surface of the nanoporous layer. Such steps can include, for example, chemical mechanical planarization (CMP). In an embodiment, the conductive material 826 can at least partially fill at least some of the nanopores. In an embodiment, the conductive material 826 can fill at least some of the nanopores at least about 50%. In an embodiment, the conductive material 826 can fill at least some of the nanopores at least about 75%. In an embodiment, the conductive material 826 can at least partially fill a majority of the nanopores. In an embodiment, the conductive material 826 can at least partially fill substantially all of the nanopores.

The next step, step 760 is the formation of an inert electrode. The article after completion of this step is illustrated in FIG. 8f and includes inert electrode 830. The inert electrode 830 can be disposed on or directly on the nanoporous layer 820. The step of forming the inert electrode, step 760, and characteristics of the active electrode 830 were discussed above.

Figure 9:
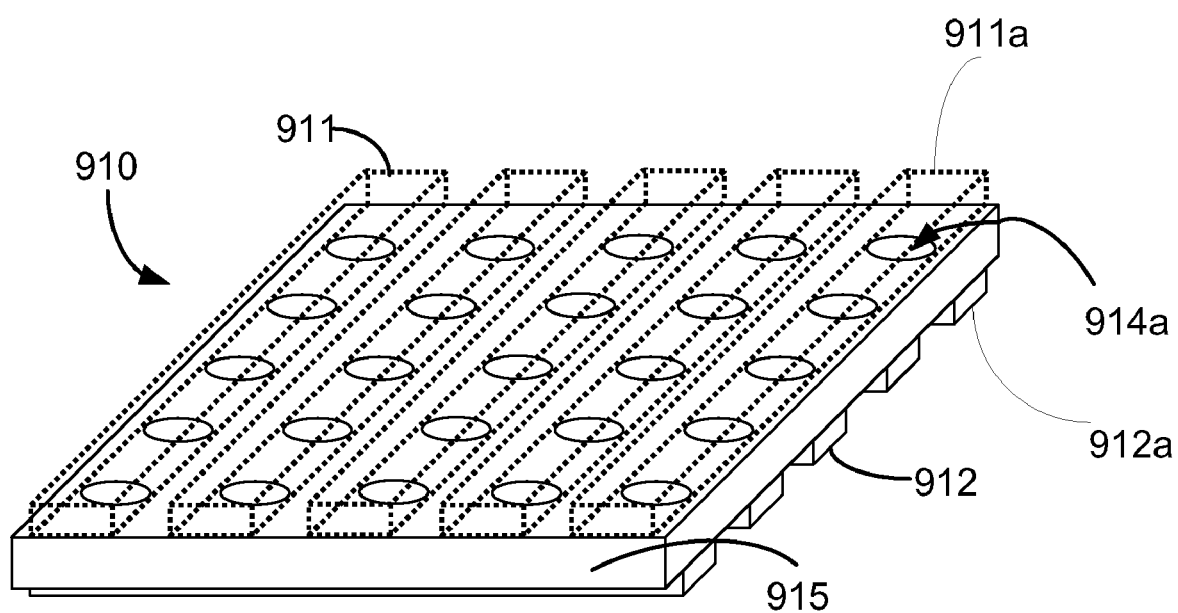
FIG. 9 is a perspective view of an illustrative memory array including PMCs.

Also disclosed herein are memory arrays that include PMCs as disclosed herein. FIG. 9 illustrates a generic array 910 having a plurality of word lines 911 and bit lines 912 that may be orthogonal to word lines 911. An exemplary word line 911a and bit line 912a are operatively connected to a PMC 914a. The PMC 914a may be part of a PMC structure 915 which can include a plurality of PMCs 914, or can have a similar layered structure across the entirety of the PMC structure 915, with PMCs 914 being defined only by the intersection of the word lines 911 and the bit lines 912. The exemplary memory array 910 is a crosspoint array structure. A select device, such as diode or transistor, although not pictured in this figure, may be present at each crosspoint.

RRAM cells as disclosed herein can be included in stand alone devices or can be integrated or embedded in devices that utilize the RAM, including but not limited to microprocessors (e.g., computer systems such as a PC e.g., a notebook computer or a desktop computer or a server) microcontrollers, dedicated machines such as cameras, and video or audio playback devices.

Thus, embodiments of PROGRAMMABLE METALLIZATION CELLS AND METHODS OF FORMING THE SAME are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A programmable metallization cell (PMC) comprising:
   an active electrode comprising silver iodide (AgI), silver sulfide (AgS), silver selenide (AgSe) copper iodide (CuI), copper sulfide (CuS), or copper selenide (CuSe);
   a sink layer disposed on the active electrode, the sink layer comprising silver (Ag) or copper (Cu);
   a nanoporous layer disposed on the active electrode, the nanoporous layer comprising a plurality of nanopores and a dielectric material; and
   an inert electrode disposed on the nanoporous layer
   wherein the sink layer is disposed between the nanoporous layer and the active electrode, and wherein material from the active electrode at least partially fills the nanopores after application of a positive voltage on the active electrode.

2. The PMC according to claim 1, wherein the nanoporous layer comprises crosslinked polystyrene.

3. The PMC according to claim 1, wherein the material from the active electrode comprises silver or copper ions.

4. The PMC according to claim 1, wherein the nanoporous layer comprises alumina ($Al_2O_3$), zirconia ($ZrO_2$) or titania ($TiO_2$).

5. The PMC according to claim 1 further comprising electroplated conductive material within at least some of the plurality of nanopores.

6. The PMC according to claim 5, wherein the nanoporous layer comprises alumina ($Al_2O_3$), zirconia ($ZrO_2$) or titania ($TiO_2$).

7. The PMC according to claim 6, wherein the nanoporous layer was formed by electrochemical anodization of an aluminum (Al), zirconium (Zr) or titanium (Ti) layer.

8. The PMC according to claim 7, wherein the aluminum (Al), zirconium (Zr), or titanium (Ti) layer was patterned before electrochemical anodization.

9. The PMC according to claim 1, wherein the sink layer has a thickness from about 50 Å to about 300 Å.

* * * * *